United States Patent [19]
Hirose et al.

[11] Patent Number: 5,416,798
[45] Date of Patent: May 16, 1995

[54] DEVICE FOR MEASURING THE AVERAGE VALUE OF PULSE SIGNALS

[75] Inventors: Masaaki Hirose, Gyoda; Kazuo Katoh, Ohsato; Yutaka Ueki, Gyoda; Yohei Hirakoso, Fukiagemachi; Mitsunori Satoh, Kumagaya; Takashi Kosuge, Gyoda, all of Japan

[73] Assignee: Advantest Corporation, Japan

[21] Appl. No.: 965,272

[22] PCT Filed: May 26, 1992

[86] PCT No.: PCT/JP92/00677
§ 371 Date: Aug. 20, 1993
§ 102(e) Date: Aug. 20, 1993

[87] PCT Pub. No.: WO92/21984
PCT Pub. Date: Dec. 10, 1992

[30] Foreign Application Priority Data

| | | | |
|---|---|---|---|
| May 27, 1991 | [JP] | Japan | 3-121436 |
| Jan. 28, 1992 | [JP] | Japan | 4-12468 |
| Jan. 30, 1992 | [JP] | Japan | 4-14417 |
| Feb. 10, 1992 | [JP] | Japan | 4-23636 |
| Feb. 10, 1992 | [JP] | Japan | 4-23637 |

[51] Int. Cl.$^6$ .................. H04B 3/46; H04B 17/00
[52] U.S. Cl. .................. 375/227; 364/575; 364/734
[58] Field of Search ............ 375/10; 324/76.11, 72.12; 364/575, 455, 364

[56] References Cited

U.S. PATENT DOCUMENTS

| | | | |
|---|---|---|---|
| 4,596,024 | 6/1986 | Thomson | 364/575 X |
| 4,680,540 | 7/1987 | Niki et al. | 324/78 D |
| 4,714,929 | 12/1987 | Davidson | 364/575 X |
| 5,052,027 | 9/1991 | Poklemba et al. | 364/734 X |

FOREIGN PATENT DOCUMENTS

| | | |
|---|---|---|
| 0284821 | 10/1988 | European Pat. Off. . |
| 0296822 | 12/1988 | European Pat. Off. . |
| 57-160669 | 10/1982 | Japan . |
| 2-176475 | 7/1992 | Japan . |

*Primary Examiner*—Stephen Chin
*Assistant Examiner*—Bryan Webster
*Attorney, Agent, or Firm*—Staas & Halsey

[57] ABSTRACT

The device of the present invention is used to measure the intensity of a disturbing wave and measures an average value of impulsive noise. The invention permits accurate and short-time measurements. Impulsive noise, which is input via a variable attenuator, a frequency converter, an intermediate-frequency amplifier and a band-pass filter of a 9 or 120 kHz pass frequency, is provided to a linear detector. The detected output is applied to a low-pass filter which is composed of CR elements and whose cut-off frequency is tens of kilohertz. By the low-pass filter, the peak value of the detected output is lowered and its width is increased. The filter output is converted by an A-D converter to a digital signal. Digital values at respective sample points in the digital signal of one frame are added by an arithmetic circuit, and the added value is divided by the number of samples to obtain an average value, which is displayed.

21 Claims, 12 Drawing Sheets

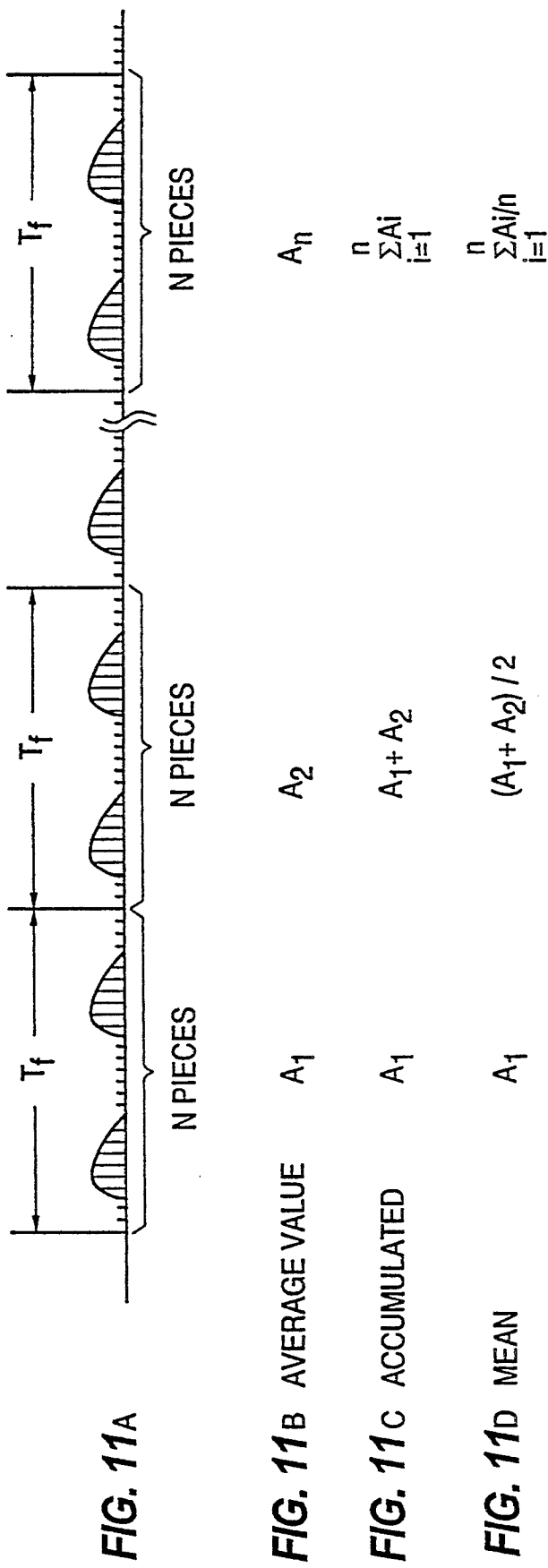

DEVICE FOR MEASURING THE AVERAGE VALUE OF PULSE SIGNALS

FIELD OF THE INVENTION

The present invention relates to a device for measuring the average value of pulse signals such as impulsive noises.

BACKGROUND ART

FIG. 1 shows a pulse noise average value measuring and display device which is used in a conventional field intensity measuring instrument or field intensity meter. An input signal from an input terminal 11 is adjusted by a variable attenuator 12 to a proper level and is then supplied to a frequency converter 13. The frequency converter 13 is supplied with a local signal from a local oscillator 14, and the input signal converted by the frequency converter 13 to an intermediate frequency is amplified by an intermediate-frequency amplifier 15. By a suitable selection of the frequency of the local signal from the local oscillator 14, an input signal of a desired frequency can be obtained as the output of the intermediate-frequency amplifier 15. From the output of the intermediate-frequency amplifier 15 is extracted by a band-pass filter 16 a specified frequency component (9 kHz or 120 kHz) according to the rules of the Comité International Special des Perturbations Radioelectriques (CISPR), and the output of the band-pass filter 16 is provided to a linear detector (or envelope detector) 17, wherein its peak value is detected, and the detected output is integrated by an integrating circuit 18. The integrated output is amplified by an amplifier 19 and its level is displayed on a display 21.

When such impulsive noises 22 as shown in FIG. 2A are provided as input signals to the input terminal 11, the linear detector 17 yields an impulse 23 corresponding to the waveform of each impulsive noise at one polarity side as shown in FIG. 2B. Such impulses are averaged by the integrating circuit 18 as depicted in FIG. 2C. That is, the area of the impulse 23 and the area of that portion of the integrated output above the zero level become equal to each other in FIG. 2A–2D.

In the case where the pulse width is remarkably small and the pulse interval $T_1$ is long relative to the peak value of the impulsive noise 22, the level of the integrated output becomes very low. For instance, when the pass frequency of the band-pass filter 16 is 120 kHz, the smallest pulse width $W_1$ of the pulse 23 available from the linear detector 17 is 0.9 $\mu$S (1/120 kHz). If the repetition frequency of the impulsive noise 22 is 100 kHz, the output of the integrating circuit 18, that is, the average value of the pulse 23, becomes 90 $\mu$V, even if the peak value $V_{p1}$ of the pulse 23 is 1 V. Thus the level difference between the peak value of the pulse 23 and the integrated output is as large as 81 dB.

As mentioned above, when the impulsive noise 22 is very short and its period of generation $T_1$ is long, the output level of the integrating circuit 18 drops very low, sometimes, close to or below the noise level. If the attenuation of the variable attenuator 12 is set small so as to avoid such a situation, the frequency converter 13 and the intermediate-frequency amplifier 15 are supplied with pulse signals of large peak values and become saturated, providing waveform distortions. For these reasons, it has been impossible to accurately measure the average value of pulse signals of extremely long pulse intervals.

The integrating circuit 18 performs integration through use of a CR circuit. To remove ripples from the integrated output and hence sufficiently smooth it, the CR time constant for the integration needs to be selected sufficiently larger, for example, about 100 times larger than the interval $T_1$ of the impulsive noise 22. Since the interval $T_1$ is 1 sec or so in some cases, the above-mentioned time constant is usually set to approximately 100 sec. This poses another problem that a large amount of time is needed to obtain accurate measured values.

The prior art uses a spectrum analyzer to measure the frequency components of impulsive noises. The conventional spectrum analyzer is shown in FIG. 3. The input signal from the input terminal 11 is adjusted by the variable attenuator 12 to a proper level and is then applied to the frequency converter 13. The frequency converter 13 is supplied with a local signal from the local oscillator 14 as well. The oscillation frequency of the local oscillator 14 is swept by a ramp signal from a ramp signal generator 24. Consequently, the frequency of the received input is swept. The intermediate-frequency amplifier 15 is capable of varying its pass frequency and gain and is provided with a pass frequency varying part 15a and a gain varying part 15b. The output of the amplifier 15 is detected by the linear detector 17, the detected output of which is periodically sampled by an A-D converter 24 and each sample value is converted to a digital signal. The digital signal is written into an image memory 26. When data of one frame of a display 27 is stored in the image memory 26, the display 27 reads out the stored contents of the image memory 26 and displays them as an image. The attenuation of the variable attenuator 12, the passing frequency and gain of the intermediate-frequency amplifier 15, the operation of the ramp signal generator 24, the operation of the A-D converter 25 and the operation of the display 27 are placed under the control of a control circuit 28 equipped with a CPU. Various parameters for measurements can be entered and set in the control circuit 28 through a keyboard 29.

For example, as shown in FIG. 4A, the frequencies and levels of received input signals are displayed as waveforms on a display screen 27a of the display 27 with the abscissa representing frequency and the ordinate level. In the case of observing temporal variations of one of the input signals, for example, a signal which seems to be an impulsive noise, the sweeping of the local oscillator 14 is stopped and its oscillation frequency is set to a value corresponding to the frequency component desired to observe, that is, the signal is received in what is called a zero span mode. In this instance, for example, as shown in FIG. 4B, the input signal waveform is displayed on the screen 27 of the display 27 with the abscissa representing time. In the prior art, however, the spectrum analyzer is not equipped with a function for obtaining the average value of impulsive noises.

An object of the present invention is to provide an average value measuring device capable of measuring the average value of pulse signals with accuracy.

Another object of the present invention is to provide an average value measuring device capable of measuring the average value of pulse signals or the like accurately and rapidly.

SUMMARY OF THE PRESENT INVENTION

According to the present invention, the input signal is frequency converted to an intermediate-frequency signal, the intermediate-frequency signal is linearly detected, the waveform of the detected output is dulled by a low-pass filter composed of passive elements alone, the output of the low-pass filter is converted by an A-D converter to a digital signal, and the digital signal is computed by an arithmetic part to obtain the average value.

The above-mentioned detected output is written into an image memory as well and the stored contents are read out therefrom and applied to a display to display temporal variations of the input signal with the abscissa representing time, while at the same time the computed average value is displayed on the display screen.

The output of the low-pass filter is written, as data of a respective frame of the display, into the memory a plurality n of times, the average value $A_i$ (where $i=1, \ldots, n$) of the data of each frame is computed and is accumulated to average values obtained so far, the accumulated value is averaged and its result $(A_1+A_2+\ldots+A_i)/i$ is displayed. Alternatively, only the last average value $(A_1+A_2 \ldots +A_n)/n$ is displayed.

Moreover, upon each computation of the average value $A_i$, it is squared and is accumulated to squares $A_i^2$ of the average values obtained so far, and the square root of the accumulated value is extracted to obtain a mean square.

The frequency of a local signal is swept, and consequently, the frequency of the input signal is swept. The detected output at that time is written into the image memory and the stored contents are read out therefrom and displayed on the display with the abscissa representing frequency. Thus the input level of the frequency converter is detected and a variable attenuator at a high-frequency stage is controlled so that the detected level has a predetermined value. In this way, automatic control is effected to prevent the frequency converter from becoming saturated by an excessive input.

Such automatic control of keeping the input to the frequency converter at a proper level is effected in the zero span mode as well.

The input signal is cut off. The frequency of the local signal is swept. The detected output of each frequency component of floor noise, corresponding to one frame, is stored in digital form in a memory. The input signal is frequency swept. The detected output of its respective frequency component, corresponding to one frame, is stored in digital form in the memory. A square $N_i^2$ of the frequency component $N_i$ of the corresponding noise is subtracted from a square $E_i^2$ of each frequency component $E_i$ of the signal thus stored. The square root of the subtracted result is extracted. Each frequency component of the extracted result is displayed on the display. The removal of floor noise as mentioned above is carried out in the zero span mode as well.

BRIEF DESCRIPTION OF THE DRAWINGS

FIG. 11A–D is a diagram for explaining the case of averaging average values over a plurality of frames.

DETAILED DESCRIPTION OF THE PRESENT

Figure 1:
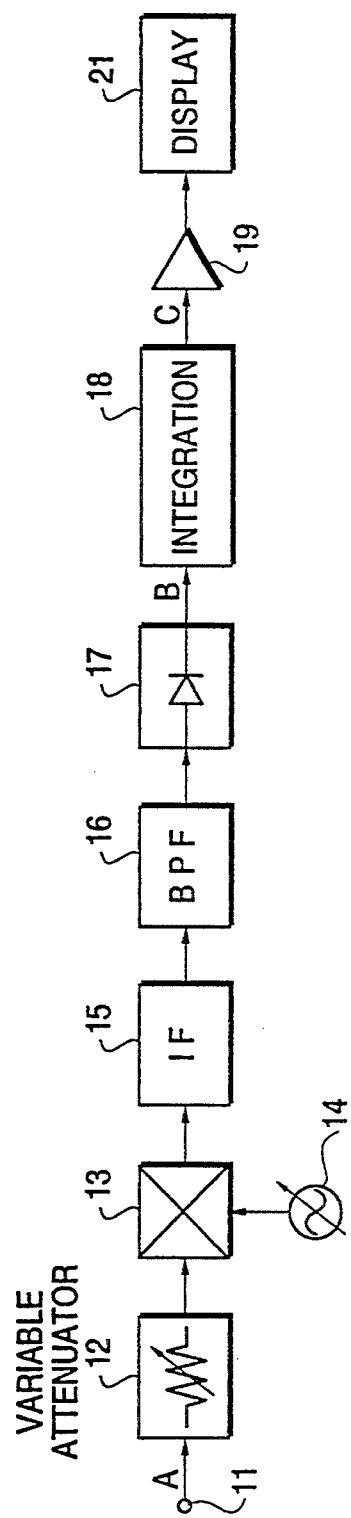
FIG. 1 is a block diagram showing a conventional device for measuring the average value of impulsive noises.
Figure 2A:
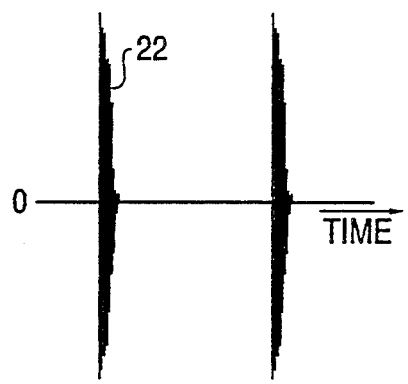
FIGS. 2A, 2B, 2C, and 2D are diagrams showing examples of waveforms of impulsive noise, its detected output, its integrated output and the output from a low-pass filter supplied with the detected output.
Figure 2B:
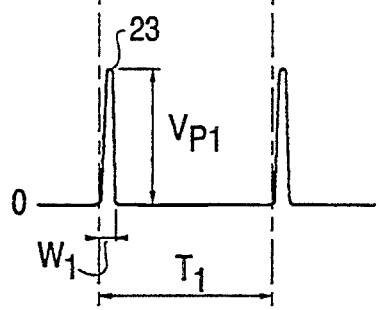
Figure 2C:
Figure 2D:
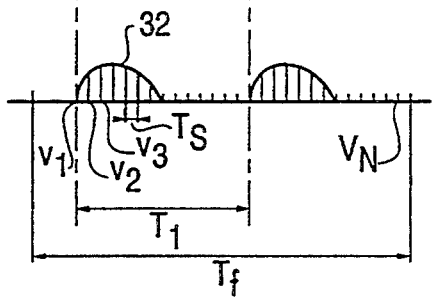
Figure 5:
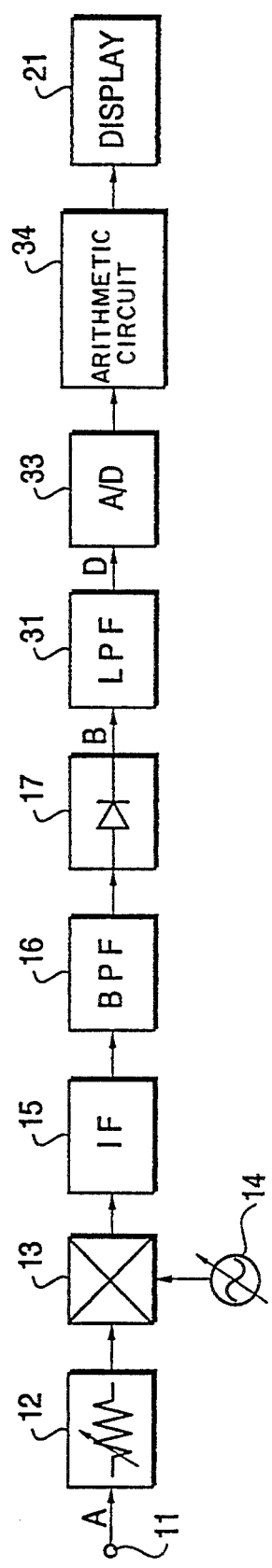
FIG. 5 is a block diagram illustrating an embodiment of the present invention.

FIG. 5 illustrates an embodiment of the present invention, in which the parts corresponding to those in FIG. 1 are identified by the same reference numerals. The construction from the input terminal 11 to the linear detector 17 is identical with the construction of FIG. 1 and follows the rules of the Comité International Spécial des Perturbations Radioelectriques (CISPR). In this embodiment the output of the linear detector 17 is fed to a low-pass filter 31 composed of passive elements alone. The low-pass-filter 31 is made up of, for example, resistance elements and capacitance elements, and its cut-off frequency is set to tens of kilohertz, tens of milliseconds in terms of time constant. Hence, as shown in FIG. 2, the detected output pulse 23 in FIG. 2B is slightly integrated by the low-pass filter 31 and, as a result, becomes an isolated wave output 32 of a dull waveform with a small peak value and an enlarged pulse width as depicted in FIG. 2D. The isolated wave output 32 is sampled by an A-D converter 33 with a period Ts, and respective sample value $V_1, V_2, \ldots$ are converted to digital values, which are provided to an arithmetic circuit 34. That is, pieces of sampled data of one frame $T_f$ at N points, for instance, 700 points are fed to the arithmetic circuit, wherein an average value is calculated; namely, $(V_1+V_2+V_3+\ldots+V_n)/n$ is calculated. In other words, a value obtained by averaging the areas of respective isolated wave outputs 32 in one frame $T_f$ is obtained as an average value A.

The peak value of the isolated wave output 32 is not small relative to the peak value of the impulsive noise 22 and is appreciably larger than the noise level, and the area of the waveform can be measured with accuracy. Since the peak value of the isolated wave output 32 is relatively large, the peak value can be lowered, by adjusting the variable attenuator, to such an extent that the frequency converter 13 and the intermediate-frequency amplifier 15 are not saturated by the impulsive noise 22, and even if the impulsive noise 22 is short and the period $T_1$ is long, the waveform will not be distorted, ensuring accurate measurement of the average value. Moreover, there is no need of smoothing the output to such an extent to remove ripples and sample values of one frame need only to be supplied-to the arithmetic circuit. Hence, the average value can be measured in a short time.

If the cut-off frequency of the low-pass filter 31 is set to, for example, 100 Hz in the case where the detected output pulse 23 has a 1 V peak value and a 100 Hz repetition frequency as in the afore-mentioned example, the peak value of the isolated wave output 23 from the low-pass filter 31 is 833 $\mu$V ($\approx$1 V·100 Hz/120 kHz), which is sufficiently larger than the noise level and can easily be processed by an ordinary linear amplifier. Further, the measuring time is the sum of the integration time of the low-pass filter 31 and the processing time of the arithmetic circuit 34, and in the above-mentioned example, since 100 Hz is the cut-off frequency, the integration time is 10 mS (=1/100 Hz) and the processing time is so short that the measuring time is a little longer than 10 mS. Thus, the measurement can be accomplished within a short time.

Figure 3:
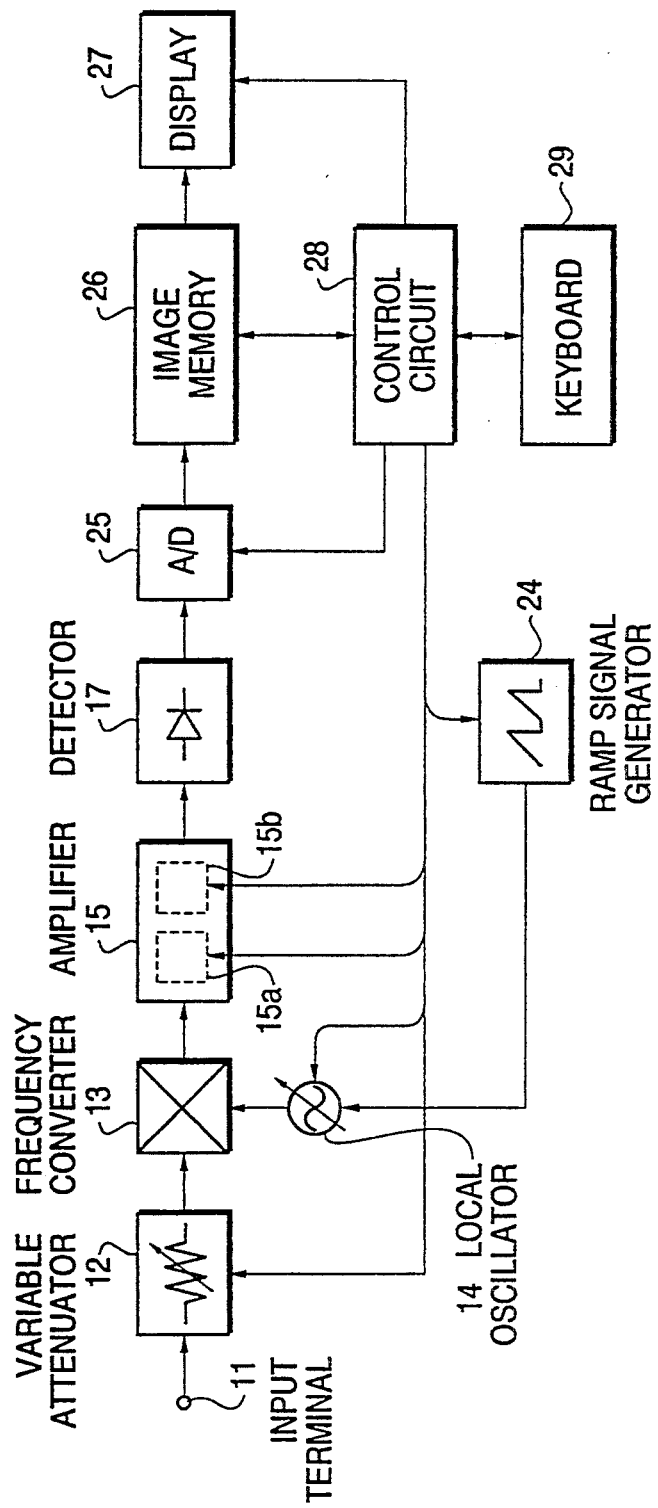
FIG. 3 is a block diagram showing a conventional spectrum analyzer.
Figure 6:
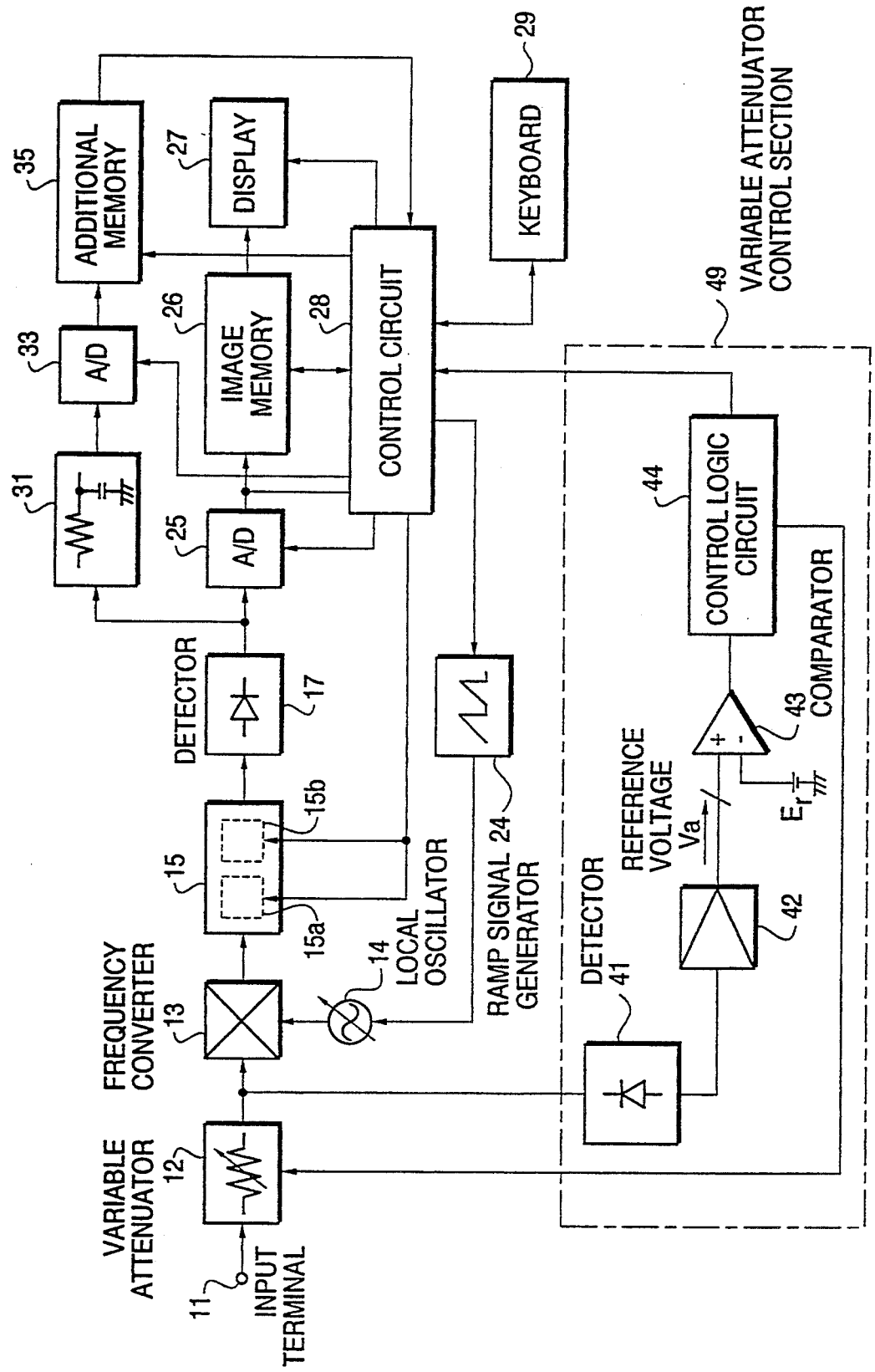
FIG. 6 is a block diagram illustrating an embodiment of a spectrum analyzer embodying the present invention.

Next, a description will be given, with reference to FIG. 6, of an embodiment of the present invention applied to a spectrum analyzer. In FIG. 6 the parts corresponding to those in FIG. 3 are identified by the same reference numerals. In this embodiment the output of the detector 17 is branched to the low-pass filter 31, the output of which is converted by the A-D converter 33 to a digital signal, which is stored in an additional memory 35. The data thus stored in the additional memory 35 is read out by the control circuit 28 and an average value of data of one frame is obtained. In this instance, the local oscillator 14 is stopped via the control circuit 28 from frequency sweep and fixed to a desired frequency, that is, placed in the zero span mode, and the pass frequency of the intermediate-frequency amplifier 15 is set to 9 kHz or 120 kHz.

Figure 7:
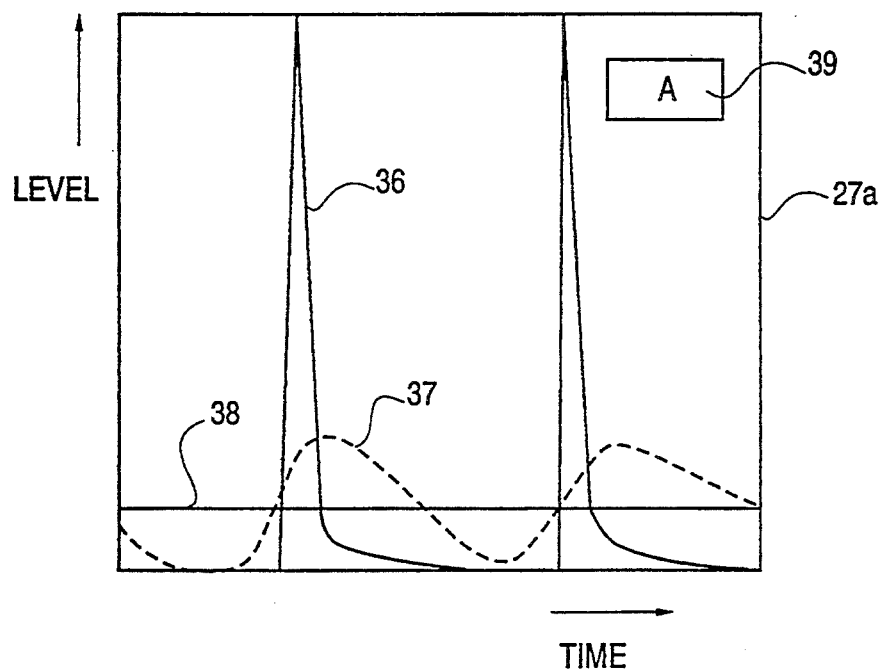
FIG. 7 is a diagram showing an example of a display of the result of measurement with the embodiment of the present invention.

When an impulsive noise is input, the temporal variation of the input impulsive noise is displayed on the screen 27a of the display 27 on the basis of data stored in the image memory 26, as indicated by the curve 36 in FIG. 7. It is also possible to observe, from the displayed waveform, whether the impulsive noise has a waveform distortion by the saturation of the frequency converter 13 or the like and adjust the variable attenuator 13 to suppress the waveform distortion so as to obtain the average value with accuracy. When such impulsive noise input, the output level of the low-pass filter 31 becomes such as indicated by the broken line 37 in FIG. 7. The output of the low-pass filter is converted to a digital signal as mentioned above, an average value of the digital signal for one frame is calculated as referred to above, and the resulting average value A is displayed as a lateral line 38 indicating the display level. That is, data for displaying the lateral line 38 is also written into the image memory 26. The average value A is displayed in the form of a numerical value in a small area 39 at one corner of the display screen, at upper right corner in this example. The data for this is also written into the image memory 26. The display of the average value may be provided by either one of the lateral line 38 and the numerical value in the area 39.

Figure 8:
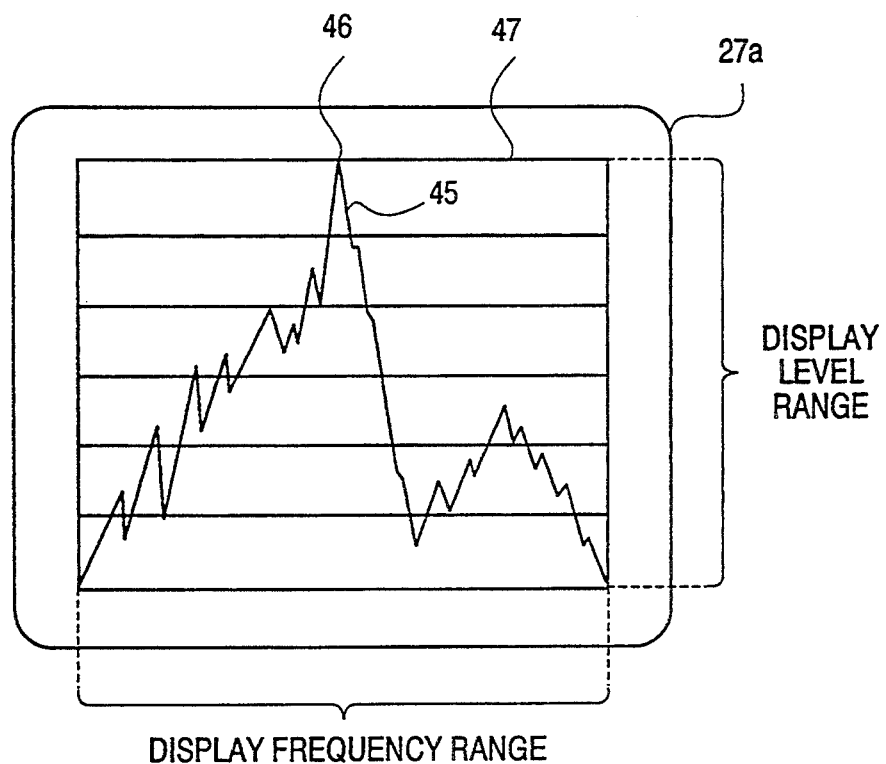
FIG. 8 is a diagram showing an example of a display in which the peak of the waveform being displayed is held at the highest display level.

Moreover, in this embodiment the input to the frequency converter 13 is branched to a detector 41, wherein it is detected and smoothed. The detected output is amplified by an amplifier 42, the amplified output Va of which is compared by a comparator 43 with a reference voltage Er, and the output of the comparator 43 is applied to a control logic circuit 44. The control logic circuit 44 increases or decreases the attenuation of the variable attenuator 12 by a predetermined quantity $\alpha$ dB, depending whether the output Va is larger or smaller than the reference voltage Er. In order that when the data in the image memory 26 is displayed on the display screen 27a of the display 27, the peak 46 of the displayed waveform 46 may be positioned at the highest level in the display region 47 as depicted in FIG. 8, the highest peak in the sample value data stored in the image memory 26 is looked for by the control circuit 28 and the gain of the intermediate-frequency amplifier 15 is precontrolled accordingly. The input level of the frequency converter 13 is preadjusted so that it becomes the maximum allowable level when the output Va of the amplifier 42 matches the reference voltage Er. When the attenuation of the variable attenuator 12 is increased by $\alpha$ dB under control of the control circuit 28 in such a situation, the control circuit 28 increases the gain of the intermediate-frequency amplifier 15 by $\alpha$ dB, and when the attenuation of the variable attenuator 12 is decreased by $\alpha$ dB, the control circuit decreases the gain of the intermediate-frequency amplifier 15 by $\alpha$ dB.

Figure 4A:
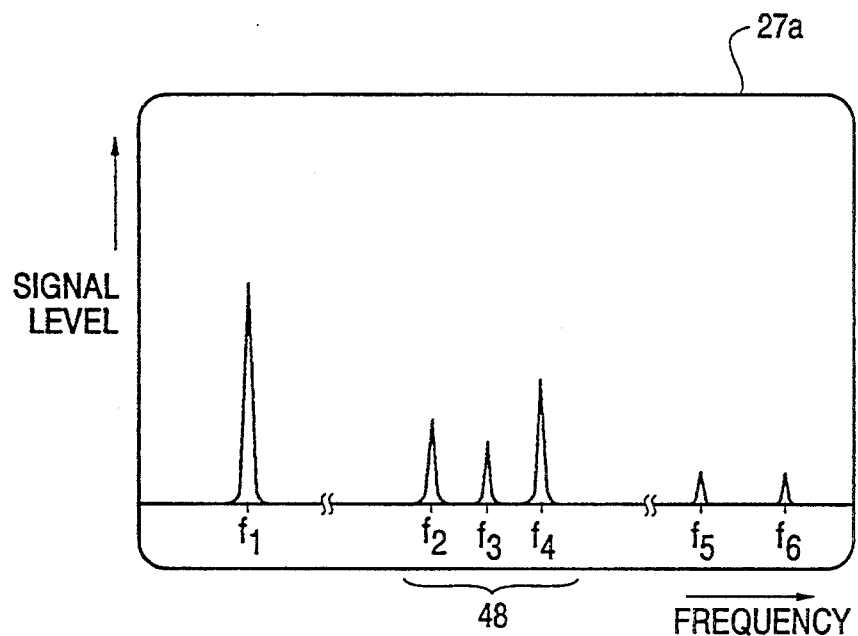
FIG. 4A–4B shows an example of a display of the frequency of an input signal by the spectrum analyzer and an example of a display of temporal variations of the input signals, with a frequency sweep stopped.

Thus, no matter what level the input signal may have, the waveform is displayed all over the display level range on the display screen 27a of the display 27, and hence is easy to see. For instance, in the case of displaying a relatively narrow frequency band 48 on the display screen 27a of the display 27 as shown in FIG. 4A, if a frequency component $f_1$ of a level appreciably higher than those of frequency components $f_2$, $f_3$ and $f_4$, which are received in the band to be displayed, also arrives at the same time, there is a possibility that the frequency converter 13 might be saturated by the frequency component $f_1$, but since a variable attenuator control section 49, which is composed of the detector 41, the amplifier 42, the comparator 43 and the control logic circuit 44, effects control to prevent the frequency converter 13 from getting saturated at all times as mentioned previously, the waveforms of the frequency components desired to display are displayed correctly. In addition, when the peak value of the displayed waveform is positioned at the highest display level on the display screen 27a as mentioned previously, the waveform is easy to see.

Also in the zero span mode, the variable attenuator control section 49 similarly serves to avoid the influence of signals of large levels other than the frequency components desired to display, permitting an accurate waveform display and an accurate average value measurement, and by positioning the peak value at the highest display level, the waveform being displayed is easy to see and the average value being measured is accurate. In the case of averaging the average values for n frames, the frames need not always be continuous; that is, an input signal of one frame is transmitted and an average value is obtained therefor, then an input signal of one frame is received and an average value is obtained therefor, and thereafter n average values similarly obtained are averaged.

Figure 9:
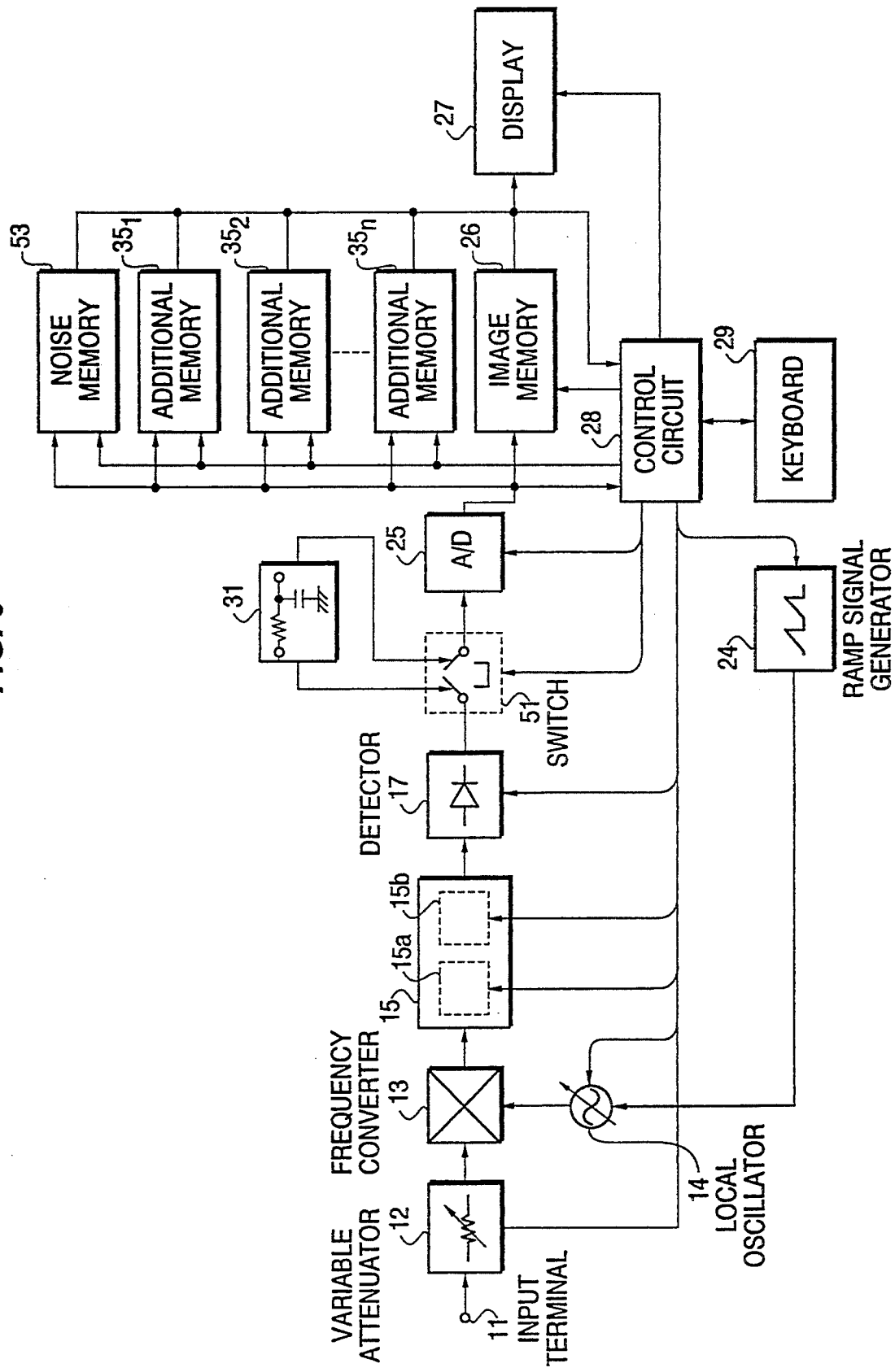
FIG. 9 is a block diagram illustrating another embodiment of the spectrum analyzer of the present invention.

The construction shown in FIG. 6 may be replaced with a construction of FIG. 9, in which the output of the detector 17 is switched by a switch S1 between a line leading directly to the A-D converter 25 and a line leading to the A-D converter 25 via the low-pass filter 31 and the A-D converter 33 is omitted accordingly. In this example, n additional memories $35_1$ to $35_n$ are provided as the additional memory 35. An operation in which the device is placed in the zero span mode, the pass frequency of the intermediate-frequency amplifier 15 is set to 9 kHz or 120 kHz, the output of the detector 17 is supplied directly to the A-D converter 25 and data of one frame is stored in the image memory 26 and an operation in which the output of the detector 17 is provided via the low-pass filter 31 and the data of one frame is stored in the additional memory $35_1$ are performed alternately with each other. The received signal and its average value may be displayed, for instance, in such a manner as shown in FIG. 7. In this case, however, the display of the signal waveform and the display of the average value are displaced one frame apart in time.

Figure 10A:
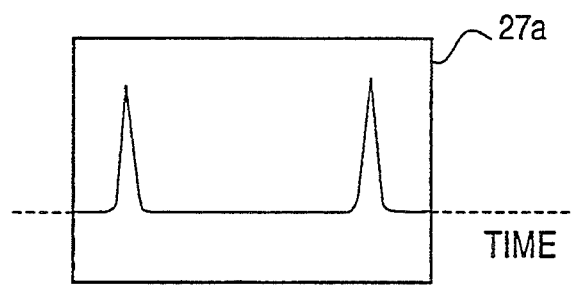
FIG. 10A–C shows, by way of example, how the number of impulses appearing on the display screen changes.

In the zero span mode, as depicted in FIGS. 10A, B and C which shows various displays appearing on the display screen of the display 27, the number of pulses by which the impulsive noise is accommodated in one frame does not remain constant, and consequently, the average value differs for each frame $T_f$. An average value for a longer time can be obtained by such a method as described below.

Figure 12:
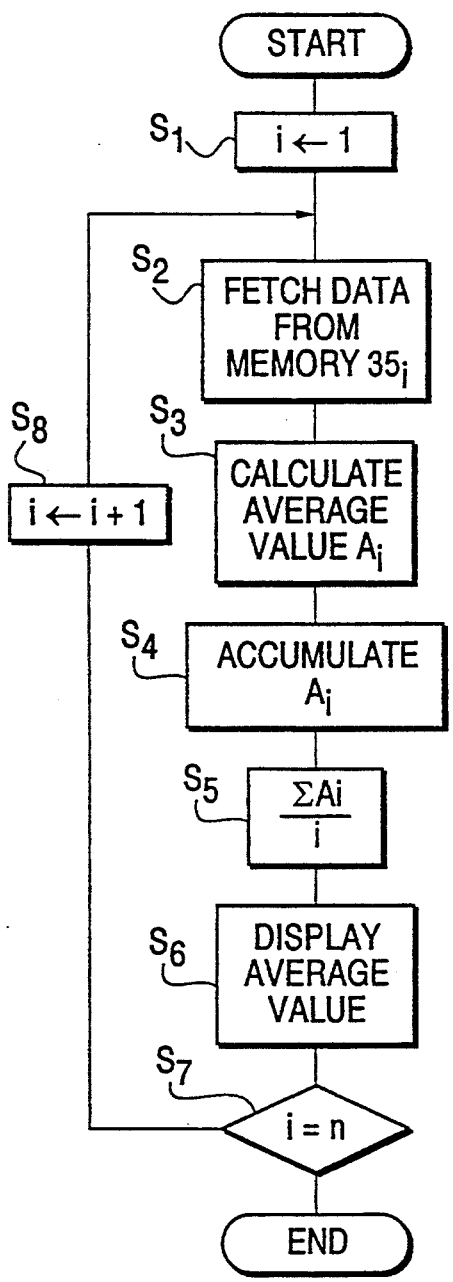
FIG. 12 is a flowchart showing an example of processing in the case of averaging average values over a plurality of frames.

That is, the device is put into the zero span mode, the pass frequency of the intermediate-frequency amplifier 15 is set to 9 kHz or 120 kHz, the output of the detector 17 is provided via the low-pass filter 31 to the A-D converter 25, and the converted data of the A-D converter 25, shown in FIG. 11A, is written into the additional memories $35_1$ through $35_n$ one after another for each frame $T_f$, that is, every N samples, for example, every 700 samples. Then, as shown in FIG. 12, i is set to a 1 (S$_1$); data stored in the additional memory $35_1$ is read out therefrom (S$_2$); an average value $A_1$ is calculated for the read-out data as described previously (S$_3$), FIG. 11D; the average value $A_1$ is accumulated (S$_4$), FIG. 11C; the accumulated value $\Sigma A_i$ is divided by i to obtain the mean of the average values obtained so far (S$_5$), FIG. 11D; and then the mean value is displayed on the display 27 (S$_6$). Next, a check is made to see if i=n (S$_n$), and if not, i is incremented by one and the process returns to step S$_2$ (S$_8$). In this way, average values of the pieces of data stored in the additional memories $35_1$ to $35_n$ are obtained and the n average values $A_1$ to $A_n$ are averaged. Hence, even if the number of pulses in each frame $T_f$ varies, an accurate average value can be obtained. It is also possible to display only the last average value $A_a$, omitting the display of the average values (S$_6$) which are obtained before i reaches n in the process shown in FIG. 12. The value n is set through the keyboard 29 to 100 through 1000, for instance.

By fetching data of respective frames into the additional memories $35_1$ through $35_n$ one after another while at the same time reading out the data therefrom and performing the process shown in FIG. 12, the number of additional memories used can be decreased smaller than n. For example, if processing for the data of one frame can be carried out within one frame $T_f$, the number of additional memories used can be two. The average value may also be obtained by averaging the corresponding ones of N (700, for example) pieces of data (sample values $V_1(i), V_2(i), \ldots, V_M(i)$) that are written into the additional memory in each frame. That is, $$A_j = [V_j(1) + V_j(2) + \ldots + V_j(n)]/n \; j=1, 2, \ldots, N$$

is obtained and the mean of such N values $A_j'$, $$A_a = (A_1 + A_2 + \ldots + A_N)/N,$$

is obtained, and this $A_a$ is displayed.

Figure 13:
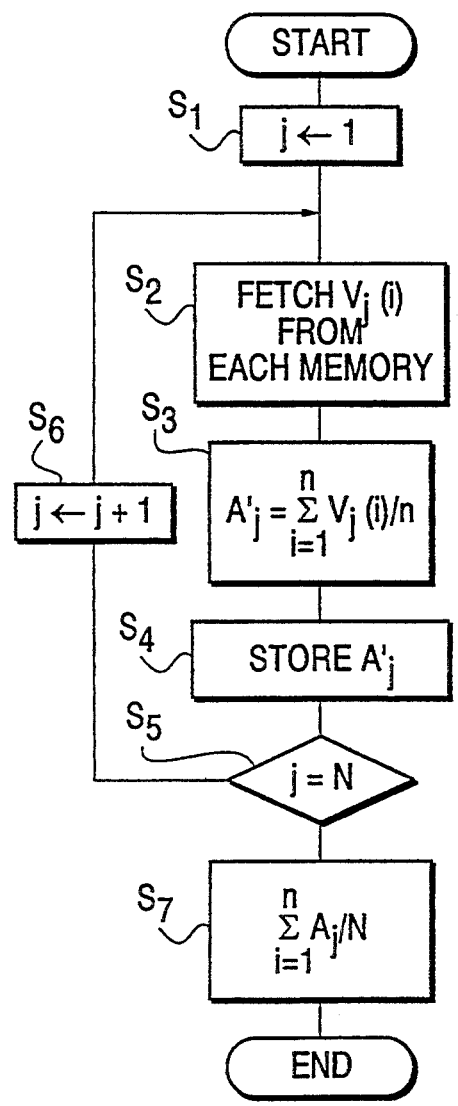
FIG. 13 is a flowchart showing another example of such

The flow of this processing is shown in FIG. 13. At first, j is set to a 1 (S$_1$), then i-th pieces of data $V_j(i)$ are read out of the memories $35_1$ through $35_n$ (S$_2$), the n pieces of data are averaged (S$_3$), the average values $A_j'$ are stored (S$_4$), a check is made to see if j=N (S$_5$), and if not so, j is incremented by 1 and the process goes back to step S$_2$. If j=N in step S$_5$, then the stored N values $A_j'$ are taken out and averaged to obtain the value $A_a$ (S$_7$).

Figure 14A:
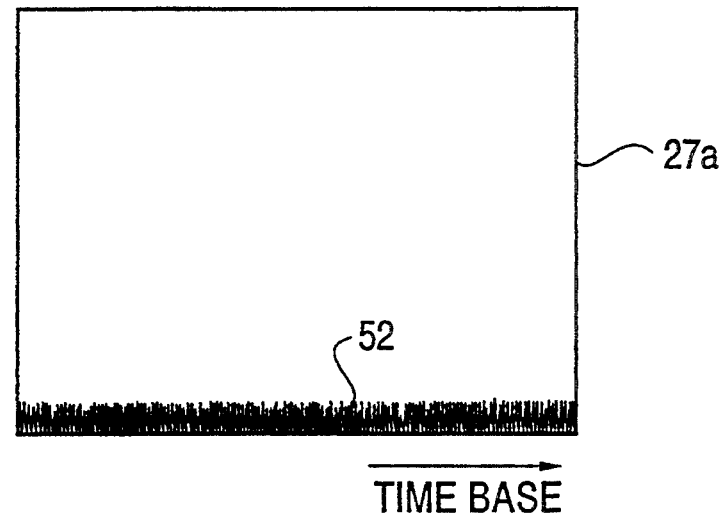
FIG. 14A–C shows examples of noise of the measuring system, a signal superimposed on the noise and a signal with the noise removed therefrom, respectively.
Figure 14B:
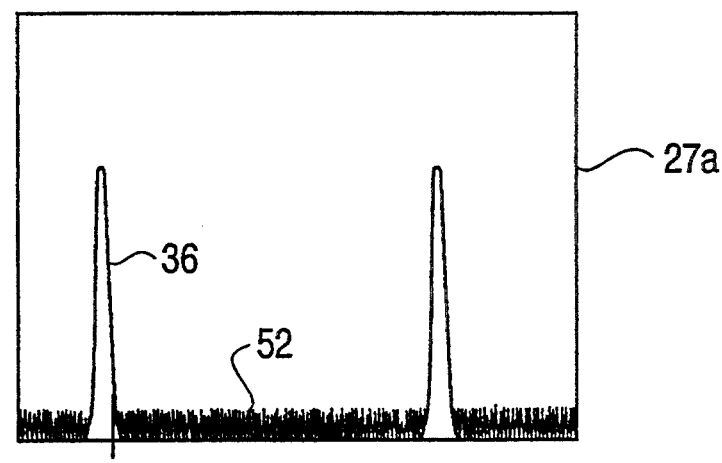

When measuring and displaying noise (mainly thermal noise) which occurs in the measuring apparatus while cutting off the input signal, noise 52 of a low level always appears on the display screen 27a as shown in FIG. 14A, for instance. If impulsive noise is received and measured by such a measuring apparatus, there will be displayed on the display screen 27a impulsive noise 36 superimposed on the noise 52 as depicted in FIG. 14B. The average value A of such coarse impulsive noise 36 becomes a very small value as referred to previously and there is a possibility of the average value being buried in the noise 52. Therefore, the removal of the component of the noise 52 will ensure more accurate measurement of the average value.

From this point of view, the output data of, for example, one frame, provided from the A-D converter 25, is fetched in each additional memory, with no signal being applied into the input terminal 11, and a mean square $N_0$ of the respective pieces of data $N_1, N_2, \ldots, N_N$ is calculated.

$$N_0 = \sqrt{\frac{N_1^2 + N_2^2 + \ldots N_N^2}{N}}$$

Figure 14C:
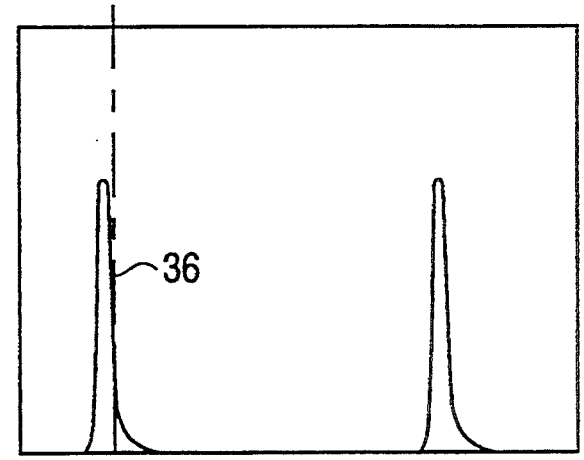

Next, the outputs $V_1, V_2, V_3, \ldots$ from the A-D converter 33 (or the A-D converter 25 supplied with the output of the low-pass filter 31), with a signal being applied to the input terminal 11, are fetched and a noise component is removed for the data at each sample point. That is, $$S_1 = \sqrt{V_1^2 - N^2} \;, S_2 = \sqrt{V_2^2 - N^2} \;,$$

$$S_3 = \sqrt{V_3^2 - N^2} \;, \ldots$$

are calculated, and an arithmetic mean is calculated using these $S_1, S_2, S_3, \ldots$ as data at the respective sample points, as described previously. In this way, an accurate average value can be obtained which is free from the influence of noise. That is, the noise on which the impulsive noise 36 is superimposed as shown in FIG. 14B is removed and an average value is calculated for only the impulsive noise shown in FIG. 14C, hence an accurate value can be obtained.

The magnitude $N_O$ of the noise 52 may be obtained not only from the mean square for one frame but also from a mean square for more sample points. It is also possible to employ the following method instead of fixedly removing the mean square $N_0$ of noise as mentioned above. Noises $N_1, N_2, \ldots, N_N$ of one frame during no-signal period are prestored in, for example, a noise memory 53 in FIG. 9 and noises at corresponding sample points are removed for the data $V_1, V_2, \ldots, V_N$ stored in the additional memory $35_l$. That is, $$S_1 = \sqrt{V_1^2 - N_1^2}, S_2 = \sqrt{V_2^2 - N_2^2}, \ldots,$$

$$S_N = \sqrt{V_N^2 - N_N^2}$$

are calculated and an average value is calculated for the results $S_1$ through $S_N$. In this instance, the noise component in the data $V_j$ and the noise $N_j$ at each corresponding sample point usually bear a random relationship, but the latter is subtracted from $V_j$ excessively or insufficiently and the noise of the measuring system is removed for one frame as a whole. In the case of averaging the average values $A_i$ for a plurality of frames, the removal of noise components is similarly performed for all the pieces of data stored in the additional memories $35_l$ through $35_n$.

We claim:

1. A device for measuring an average value of pulse signals, which receives an input signal, said device comprising:
   a level adjuster, receiving the input signal and transmitting a first output;
   a frequency converter, coupled to the level adjuster, receiving the first output and transmitting a second output;
   a variable frequency local oscillator coupled to the frequency converter and transmitting a local signal to the frequency converter;
   an intermediate-frequency amplifier, coupled to the frequency converter, receiving the second output and transmitting a third output;
   a detector receiving the third output and transmitting a fourth output;
   band-pass filter means provided in series between the intermediate frequency amplifier and the detector;
   a low-pass filter receiving the fourth output, the low-pass filter comprising passive elements, and transmitting a fifth output;
   A-D converter means, coupled to the low-pass filter, for periodically sampling and converting the fifth output to a digital value;
   calculating means, coupled to the A-D converter means, for receiving the digital value for calculating an average value of digital values within a predetermined period (a frame), and for transmitting a calculated average value; and
   display means for displaying the calculated average value.

2. A device for measuring an average value of pulse signals as claimed in claim 1, wherein said A-D converter means further outputs output data by respective frames, said device further comprising:
   A-D converter means for periodically sampling the fourth output, for producing a plurality of samples, and for converting each of the plurality of samples to a corresponding digital value and producing converted data corresponding to each of the respective frames;
   an image memory storing the converted data of the each of the respective frames; and
   means for reading out the converted data from the image memory, for displaying the converted data as a waveform on the display means and for displaying the calculated average value as a numerical value.

3. A device for measuring an average value of pulse signals as claimed in claim 1, wherein said A-D converter means further outputs output data by respective frames, said device further comprising:
   A-D converter means for periodically sampling the fourth output, for producing a plurality of samples, for converting each of the plurality of samples to a corresponding digital value and for producing A-D converted data corresponding to each of the respective frames;
   an image memory storing one of the respective frames of the A-D converted data; and
   means for reading out the A-D converted data from the image memory, for displaying the A-D converted data as a waveform with a time base on the display means and for displaying on the waveform the calculated average value by a level of a line parallel to the time base.

4. A device for measuring an average value of pulse signals as claimed in claim 1, wherein said A-D converter means further outputs output data by respective frames, said device further comprising:
   means for storing noise data of one of the respective frames provided from the A-D converter means, with no signal being input; and
   means for subtracting a square of a value of stored noise data at the each of the sample points in the one of the respective frames from a square of the digital value output by the A-D converter means during a signal input state, for producing a subtracted result, for extracting a square root of the subtracted result for producing an extracted result, and for providing the extracted result to the calculating means as a substitute for the digital value output by the A-D converter means.

5. A device for measuring an average value of pulse signals, which receives an input signal, said device comprising:
   a level adjuster, receiving the input signal and transmitting a first output;
   a frequency converter, coupled to the level adjuster, receiving the first output and transmitting a second output;
   a variable frequency local oscillator, coupled to the frequency converter and transmitting a local signal to the frequency converter;
   an intermediate-frequency amplifier, coupled to the frequency converter, receiving the second output and transmitting a third output;
   a detector receiving the third output and transmitting a fourth output;
   band-pass filter means provided in series between the intermediate frequency amplifier and the detector;
   a low-pass filter receiving the fourth output, be low-pass filter comprising passive elements, and transmitting a fifth output;
   A-D converter means, coupled to the low-pass filter, for periodically sampling and converting the fifth output to a digital value;
   calculating means, coupled to the A-D converter means, for receiving the digital value, for calculating an average value of digital values within a predetermined period (a frame), and for transmitting a calculated average value; and display means for displaying the calculated average value, wherein the calculating means comprises:

means for accumulating each average value obtained for each frame and for producing an accumulated value, and means for dividing the accumulated value by a number of accumulations, for producing a divided result, and for displaying the divided result, as an average value for the input signal, on the display means.

6. A device for measuring an average value of pulse signals as claimed in claim 5 which further comprises;

a plurality of storage means, coupled to the A-D converter means, each of said plurality of storage means for storing the output data, corresponding to sample points, of one of the respective frames provided from the A-D converter means, the output data from the A-D converter means being sequentially stored in the storage means frame by frame; and the calculating means further comprises means for reading out the data stored in the storage means, starting with oldest data of one of the respective frames, and for calculating the average value to thereby obtain an average value for a plurality of continuous frames of the input signal.

7. A device for measuring an average value of pulse signals as claimed in claim 5, wherein said A-D converter means further outputs output data by respective frames, said device further comprising:

A-D converter means for periodically sampling the fourth output, for producing a plurality of samples, and for converting each of the plurality of samples to a corresponding digital value and producing converted data corresponding to each of the respective frames;

an image memory storing the converted data of the each of the respective frames; and means for reading out the converted data from the image memory, for displaying the converted data as a waveform on the display means and for displaying the calculated average value as a numerical value.

8. A device for measuring an average value of pulse signals as claimed in claim 5, wherein said A-D converter means further outputs output data by respective frames, said device further comprising:

A-D converter means for periodically sampling the fourth output, for producing a plurality of samples, for converting each of the plurality of samples to a corresponding digital value and for producing A-D converted data corresponding to each of the respective frames;

an image memory storing one of the respective frames of the A-D converted data; and means for reading out the A-D converted data from the image memory, for displaying the A-D converted data as a waveform with a time base on the display means and for displaying on the waveform the calculated average value by a level of a line parallel to the time base.

9. A device for measuring an average value of pulse signals as claimed in claim 5, wherein said A-D converter means further outputs output data by respective frames, said device further comprising:

means for storing noise data of one of the respective frames provided from the A-D converter means, with no signal being input; and means for subtracting a square of a value of stored noise data at the each of the sample points in the one of the respective frames from a square of the digital value output by the A-D converter means during a signal input state, for producing a subtracted result, for extracting a square root of the subtracted result for producing an extracted result, and for providing the extracted result to the calculating means as a substitute for the digital value output by the A-D converter means.

10. A device for measuring an average value of pulse signals as claimed in claim 6, wherein said A-D converter means further outputs output data by respective frames, said device further comprising:

A-D converter means for periodically sampling the fourth output, for producing a plurality of samples, and for converting each of the plurality of samples to a corresponding digital value and producing converted data corresponding to each of the respective frames;

an image memory storing the converted data of the each of the respective frames; and means for reading out the converted data from the image memory, for displaying the converted data as a waveform on the display means and for displaying the calculated average value as a numerical value.

11. A device for measuring an average value of pulse signals as claimed in claim 6, wherein said A-D converter means further outputs output data by respective frames, said device further comprising:

A-D converter means for periodically sampling the fourth output, for producing a plurality of samples, for converting each of the plurality of samples to a corresponding digital value and for producing A-D converted data corresponding to each of the respective frames;

an image memory storing one of the respective frames of the A-D converted data; and means for reading out the A-D converted data from the image memory, for displaying the A-D converted data as a waveform with a time base on the display means and for displaying on the waveform the calculated average value by a level of a line parallel to the time base.

12. A device for measuring an average value of pulse signals as claimed in claim 6, wherein said A-D converter means further outputs output data by respective frames, said device further comprising:

means for storing noise data of one of the respective frames provided from the A-D converter means, with no signal being input; and means for subtracting a square of a value of stored noise data at the each of the sample points in the one of the respective frames from a square of the digital value output by the A-D converter means during a signal input state, for producing a subtracted result, for extracting a square root of the subtracted result for producing an extracted result, and for providing the extracted result to the calculating means as a substitute for the digital value output by the A-D converter means.

13. A device for measuring an average value of pulse signals which receives an input signal, said device comprising:

a level adjuster, receiving the input signal and transmitting a first output;

a frequency converter, coupled to the level adjuster, receiving the first output and transmitting a second output;

a variable frequency local oscillator, coupled to the frequency converter and transmitting a local signal to the frequency converter;

an intermediate-frequency amplifier, coupled to the frequency converter, receiving the second output and transmitting a third output;

a detector receiving the third output and transmitting a fourth output;

band-pass filter means provided in series between the intermediate frequency amplifier converter and the detector;

a low-pass filter receiving the fourth output, the low-pass filter comprising passive elements, and transmitting a fifth output;

A-D converter means, coupled to the low-pass filter, for periodically sampling and converting the fifth output to a digital value, and for outputting output data by respective frames;

a plurality of storage means, coupled to the A-D converter means, each of said plurality of storage means for storing the output data, corresponding to sample points, of one of the respective frames from the A-D converter means;

calculating means, coupled to the A-D converter means, for receiving the digital value, for calculating an average value of digital values within a predetermined period (a frame, and for transmitting a calculated average value the calculating means comprising:

means for accumulating and averaging data at the sample points of the respective frames, stored in the plurality of storage means, and for producing accumulated and averaged values at each of the sample points in the respective frames, and means for accumulating and averaging the accumulated and averaged values at respective sample points in the one of the respective frames to obtain an average value of the input signal; and display means for displaying the calculated average value.

14. A device for measuring an average value of pulse signals, a as in any one of claims 1, 5, 6, or 13 inclusive, which further comprises:

means for calculating a mean noise from a square mean of plural pieces of noise data from the A-D converter means during a no-signal input ; and means for subtracting a square of the mean noise from a square of each digital value output by the A-D converter means during a signal input state, for producing a subtracted result, for extracting the square root of the subtracted result for producing an extracted result, and for providing the extracted result to the calculating means as a substitute for the digital value output by the A-D converter means.

15. A device for measuring an average value of pulse signals which receives an input signal, said device comprising:

a level adjuster, receiving the input signal and transmitting a first output;

a frequency converter, coupled to the level adjuster, receiving the first output and transmitting a second output;

a variable frequency local oscillator, coupled to the frequency converter and transmitting a local signal to the frequency converter;

an intermediate-frequency amplifier, coupled to the frequency converter, receiving the second output and transmitting a third output;

a detector receiving the third output and transmitting a fourth output;

band-pass filter means provided in series between the intermediate frequency amplifier converter and the detector;

a low-pass filter receiving the fourth output, the low-pass filter comprising passive elements, and transmitting a fifth output;

A-D converter means, coupled to the low-pass filter, for periodically sampling and converting the fifth output to a digital value, and for outputting output data by respective frames;

a plurality of storage means, coupled to the A-D converter means, each of said plurality of storage means for storing the output data, corresponding to sample points, of one of the respective frames from the A-D converter means;

calculating means, coupled to the A-D converter means, for receiving the digital value, for calculating an average value of digital values within a predetermined period (a frame), and for transmitting a calculated average value, the calculating means comprising:

means for accumulating and averaging data at the sample points of the respective frames, stored in the plurality of storage means, and for producing accumulated and averaged values at each of the sample points in the respective frames, and means for accumulating and averaging the accumulated and averaged values at respective sample points in the one of the respective frames to obtain an average value of the input signal;

A-D converter means for periodically sampling the fourth output for producing a plurality of samples, and for converting each of the plurality of samples to a corresponding digital value and producing converted data corresponding to each of the respective frames;

an image memory storing the converted data of the one of the respective frames;

display means for displaying the calculated average value; and means for reading out the converted data from the image memory, for displaying the converted data as a waveform on the display means and for displaying the calculated average value as a numerical value.

16. A device for measuring an average value of pulse signals as claimed in claim 15, which further comprises:

means for detecting a level of the first output and for producing a detected level;

means, responsive to the detected level, for controlling the level adjuster so that the level of the first output is adjusted to be substantially equal to a predetermined value; and means for controlling a gain of the intermediate-frequency amplifier so that the third output undergoes a change opposite in direction to a change in the first output made by the level adjuster.

17. A device for measuring an average value of pulse signals as claimed in claim 16, which further comprises:

means for detecting a highest peak valued in the converted data stored in the image memory and for producing a detected peak value; and means for controlling the gain of the intermediate-frequency amplifier so that the detected peak value substantially matches a maximum level of the display means.

18. A device for measuring an average value of pulse signals which receives an input signal, said device comprising:

a level adjuster, receiving the input signal and transmitting a first output;

a frequency converter, coupled to the level adjuster, receiving the first output and transmitting a second output;

a variable frequency local oscillator, coupled to the frequency converter and transmitting a local signal to the frequency converter;

an intermediate-frequency amplifier, coupled to the frequency converter, receiving the second output and transmitting a third output;

a detector receiving the third output and transmitting a fourth output;

band-pass filter means provided in series between the intermediate frequency amplifier converter and the detector;

a low-pass filter receiving the fourth output, the low-pass filter comprising passive elements, and transmitting a fifth output;

A-D converter means, coupled to the low-pass filter, for periodically sampling and converting the fifth output to a digital value, and for outputting output data by respective frames;

a plurality of storage means, coupled to the A-D converter means, each of said plurality of storage means for storing the output data, corresponding to sample points, of one of the respective frames from the A-D converter means;

calculating means, coupled to the A-D converter means, for receiving the digital value, for calculating an average value of digital values within a predetermined period (a frame), and for transmitting a calculated average value, the calculating means comprising:

means for accumulating and averaging data at the sample points of the respective frames, stored in the plurality of storage means, and for producing accumulated and averaged values at each of the sample points in the respective frames, and means for accumulating and averaging the accumulated and averaged values at respective sample points in the one of the respective frames to obtain an average value of the input signal;

A-D converter means for periodically sampling the fourth output for producing a plurality of samples, for converting each of the plurality of samples to a corresponding digital value and for producing A-D converted data corresponding to each of the respective frames;

an image memory storing one of the respective frames of the A-D converted data;

display means for displaying the calculated average value; and means for reading out the A-D converted data from the image memory, for displaying the A-D converted data as a waveform with a time base on the display means and for displaying on the waveform the calculated average value by a level of a line parallel to the time base.

19. A device for measuring an average value of pulse signals as claimed in claim 18, which further comprises:

means for detecting the first output and for producing a detected level;

means, responsive to the detected level, for controlling the level adjuster so that the first output is adjusted to be substantially equal to a predetermined value; and means for controlling a gain of the intermediate-frequency amplifier so that the third output undergoes a change opposite in direction to a change in the first output made by the level adjuster.

20. A device for measuring an average value of pulse signals which receives an input signal, said device comprising:

a level adjuster, receiving the input signal and transmitting a first output;

a frequency converter, coupled to the level adjuster, receiving the first output and transmitting a second output;

a variable frequency local oscillator, coupled to the frequency converter and transmitting a local signal to the frequency converter;

an intermediate-frequency amplifier, coupled to the frequency converter, receiving the second output and transmitting a third output;

a detector receiving the third output and transmitting a fourth output;

band-pass filter means provided in series between the intermediate frequency amplifier converter and the detector;

a low-pass filter, coupled to the detector and receiving the fourth output, the low-pass filter comprising passive elements, and transmitting a fifth output;

A-D converter means, coupled to the low-pass filter, for periodically sampling and converting the fifth output to a digital value, and for outputting output data by respective frames;

a plurality of storage means, coupled to the A-D converter means, each of said plurality of storage means for storing the output data, corresponding to sample points, of one of the respective frames from the A-D converter means;

calculating means, coupled to the A-D converter means, for receiving the digital value, for calculating an average value of digital values within a predetermined period (a frame), and for transmitting a calculated average value, the calculating means comprising:

means for accumulating and averaging data at the sample points of the respective frames, stored in the plurality of storage means, and for producing accumulated and averaged values at each of the sample points in the respective frames, and means for accumulating and averaging the accumulated and averaged values at respective sample points in the one of the respective frames to obtain an average value of the input signal;

display means for displaying the calculated average value;

means for storing noise data of one of the respective frames provided from the A-D converter means, with no signal being input; and means for subtracting a square of a value of stored noise data at the each of the sample points in the one of the respective frames from a square of the digital value output by the A-D converter means during a signal input state, for producing a subtracted result, for extracting a square root of the subtracted result for producing an extracted result, and for providing the extracted result to the calculating means as a substitute for the digital value output by the A-D converter means.

21. A device for measuring an average value of pulse signals, which receives an input signal, said device comprising:

a level adjuster, receiving the input signal and transmitting a first output;

a frequency converter, coupled to the level adjuster, receiving the first output and transmitting a second output;

a variable frequency local oscillator, coupled to the frequency converter and transmitting a local signal to the frequency converter;

an intermediate-frequency amplifier, coupled to the frequency converter, receiving the second output and transmitting a third output;

a detector receiving the third output and transmitting a fourth output;

band-pass filter means provided in series between the intermediate frequency amplifier converter and the detector;

a low-pass filter, coupled to the detector and receiving the fourth output, the low-pass filter comprising passive elements, and transmitting a fifth output;

A-D converter means, coupled to the low-pass filter, for periodically sampling and converting the fifth output to a digital value, and for outputting output data by respective frames;

a plurality of storage means, coupled to the A-D converter means, each of said plurality of storage means for storing the output data, corresponding to sample points, of one of the respective frames from the A-D converter means;

calculating means, coupled to the A-D converter means, for receiving the digital value, for calculating an average value of digital values within a predetermined period (a frame), and for transmitting a calculated average value, the calculating means comprising:

means for accumulating and averaging data at the sample points of the respective frames, stored in the plurality of storage means, and for producing accumulated and averaged values at each of the sample points in the respective frames, and means for accumulating and averaging the accumulated and averaged values at respective sample points in one of the respective frames to obtain an average value of the input signal;

display means for displaying the calculated average value;

means for calculating a mean noise from a square mean of plural pieces of noise data from the A-D converter means during a no-signal input state; and means for subtracting a square of the mean noise from a square of each digital value output by the A-D converter means during a signal input state, for producing a subtracted result, for extracting the square root of the subtracted result, for producing an extracted result, and for providing the extracted result to the calculating means as a substitute for the digital value output by the A-D converter means.

* * * * *

UNITED STATES PATENT AND TRADEMARK OFFICE
CERTIFICATE OF CORRECTION

PATENT NO. : 5,416,798
DATED : May 16, 1995
INVENTOR(S) : Hirose et al

It is certified that error appears in the above-indentified patent and that said Letters Patent is hereby corrected as shown below:

On the title page, item [73] before "Japan" insert --Tokyo,--.

Col. 1, line 29, change "Special" to --Spécial--.

Col. 1, line 44, change "FIG" to --FIGS--.

Col. 3, line 20, change "n" to --n--.

Figure 4B:
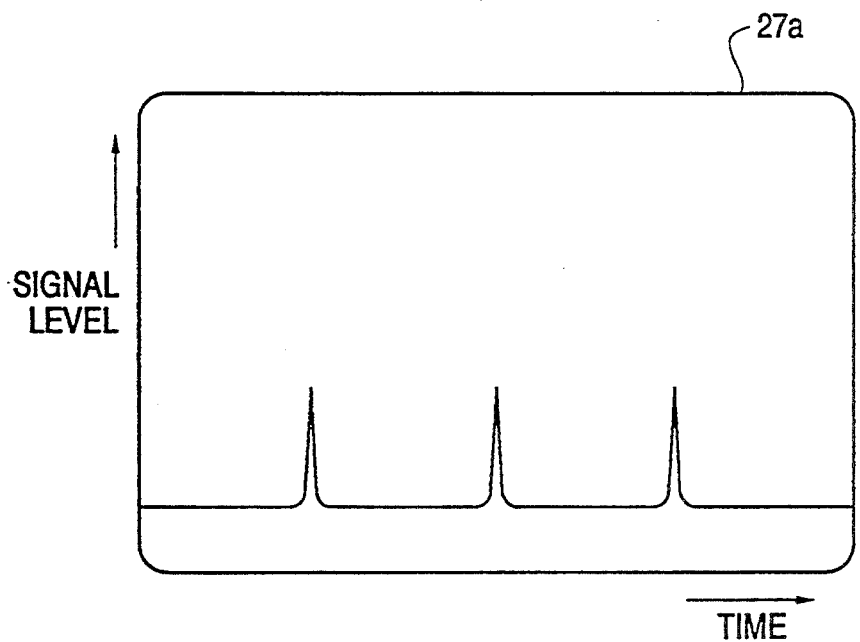

Col. 4, line 3, change "FIG. 4A-4B shows" to --FIGS. 4A and 4B show--.

Figure 10B:
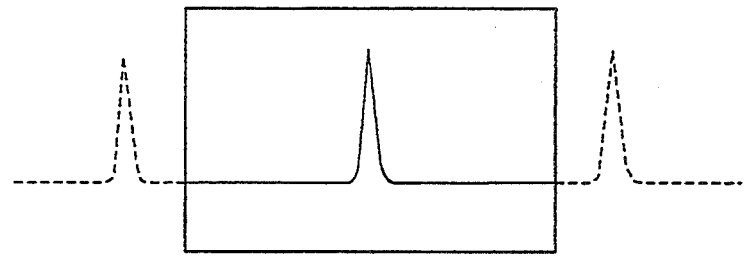
Figure 10C:
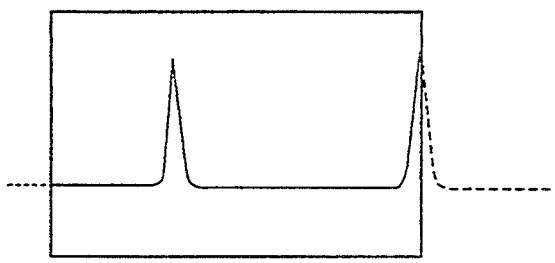

Col. 4, line 21 change "FIG. 10A-C shows" to --FIGS. 10B and 10C show--.

Signed and Sealed this

Fourteenth Day of November, 1995

Attest:

BRUCE LEHMAN

*Attesting Officer*      *Commissioner of Patents and Trademarks*